US008188876B1

(12) United States Patent  (10) Patent No.: US 8,188,876 B1
Holley et al.  (45) Date of Patent: May 29, 2012

(54) INTEGRATED BATTERY LEVEL INDICATOR, METHOD AND CIRCUIT FOR A TROLLING MOTOR CONTROLLER

(75) Inventors: Steven E. Holley, Cushing, OK (US); Jason M. Bentz, Broken Arrow, OK (US)

(73) Assignee: Brunswick Corporation, Lake Forest, IL (US)

( * ) Notice: Subject to any disclaimer, the term of this patent is extended or adjusted under 35 U.S.C. 154(b) by 434 days.

(21) Appl. No.: 12/474,666

(22) Filed: May 29, 2009

(51) Int. Cl.
G08B 21/00 (2006.01)
(52) U.S. Cl. .................................. 340/636.15
(58) Field of Classification Search ............. 340/636.15, 340/636.1, 661, 660, 636.19; 320/134, 137
See application file for complete search history.

(56) References Cited

U.S. PATENT DOCUMENTS

| 5,416,402 | A | | 5/1995 | Reher et al. | |
| 5,449,570 | A | | 9/1995 | Inkmann et al. | |
| 5,686,895 | A | * | 11/1997 | Nakai et al. | 340/636.1 |
| 5,798,702 | A | * | 8/1998 | Okamoto et al. | 340/636.1 |
| 6,222,370 | B1 | * | 4/2001 | Schousek et al. | 324/436 |
| 6,276,975 | B1 | * | 8/2001 | Knight | 440/2 |
| 7,513,324 | B2 | * | 4/2009 | Bergum et al. | 180/65.1 |

* cited by examiner

Primary Examiner — Phung Nguyen
(74) Attorney, Agent, or Firm — Andrus, Sceales, Starke & Sawall, LLP

(57) ABSTRACT

The integrated batter level indicator method and circuit of the present application provides an LED bar graph display proportional to a range of variable throttle control that provides range of speed indication, direction indication, as well as a battery level indicator. The bar graph display is configured to switch between speed or battery mode, preferably switching to battery mode when a user turns the throttle to an off position, while indicating direction of the motor at all times when the motor is in use. The integrated battery level indicator and circuit displays an amount of battery power remaining in the battery by comparing the input signal to a high and low reference level such that as the input varies between the high and low reference levels, the battery voltage is displayed on the indicator. The indicator and circuit of the present application further includes the bar graph display being integrated into the controller head cover of the controller head assembly such that a user can easily view the indicator and even be reminded of the battery level charge without having to think about it or search for it.

24 Claims, 4 Drawing Sheets

INTEGRATED BATTERY LEVEL INDICATOR, METHOD AND CIRCUIT FOR A TROLLING MOTOR CONTROLLER

FIELD

The present application is directed to the field of trolling motors. More specifically, the present application is directed to the field of integrated battery level indicator design in trolling motors.

BACKGROUND

When fishing all day with a trolling motor, it is important not to deplete the battery source below the level necessary to either keep fishing and/or return to dock. A way of monitoring the battery condition is essential to not spoil an otherwise successful fishing trip. A battery monitor, of which there are several solutions on the market, can solve this problem. However, the battery monitor must be so convenient, automatic, and intuitive that the fisherman will never fail to know the battery condition.

The problem with existing battery monitors on trolling motors is that they do not alert the fisherman about battery condition until the fisherman pushes a button to activate the report. By the time he remembers to check the battery condition it may be too late. In addition, current battery condition reports are made via displays that the fisherman cannot readily see unless given direct attention. Existing battery monitors utilize predetermined voltage threshold levels when determining when to notify a user of a low battery level. However, these systems do not take into account specific battery characteristics, that may be unique to certain types of batteries, or certain voltage levels of batteries. For example, many trolling motor systems are capable of utilizing batteries of various voltage levels, or batteries made up of different materials, such that utilizing predetermined voltage threshold levels will not accurately and efficiently assist a user in determining when that particular battery is low. In the case of utilizing batteries of different voltage levels, a predetermined voltage threshold level as an indicator of low battery will indicate a low battery level for very different percentages of total battery life for each of the different batteries. In the case of batteries utilizing different materials, these batteries have very different discharge rates, and therefore having a predetermined voltage threshold level is not an effective way to notify a user.

SUMMARY

The integrated battery level indicator, method and circuit of the present application provides an LED bar graph display proportional to a range of variable throttle control that provides range of speed indication, direction indication, as well as a battery level indicator. The bar graph display is configured to switch between speed or battery mode, preferably switching to battery mode when a user turns the throttle to an off position, while indicating direction of the motor at all times when the motor is in use. The integrated battery level indicator and circuit displays an amount of battery power remaining in the battery by comparing the input signal to a high and low reference level such that as the input varies between the high and low reference levels, the battery voltage is displayed on the indicator. The indicator and circuit of the present application further includes the bar graph display being integrated into the controller head cover of the controller head assembly such that a user can easily view the indicator and even be reminded of the battery level charge without having to think about it or search for it.

DETAILED DESCRIPTION

Present battery monitors on trolling motors require the operator to remember to push a button or otherwise activate the reporting process. The system of the present application reports the battery condition automatically each time the operator operates the trolling motor and returns the throttle control to an off position. By this high frequency of reporting, the operator does not need to make a conscious effort to keep track of the fuel gauge. The operator continually knows when he must either change the battery or start back to dock to avoid running out of power.

Present battery monitors do not purposely attempt to get the attention of the operator. The system of the present application uses high brightness, high visibility LEDs in an easy-to-read bar graph presentation to notify the operator with little to no effort on the part of the operator. The presentation is effectuated by mounting the LEDs such that they are displayed through apertures in the trolling motor controller head assembly.

Figure 1:
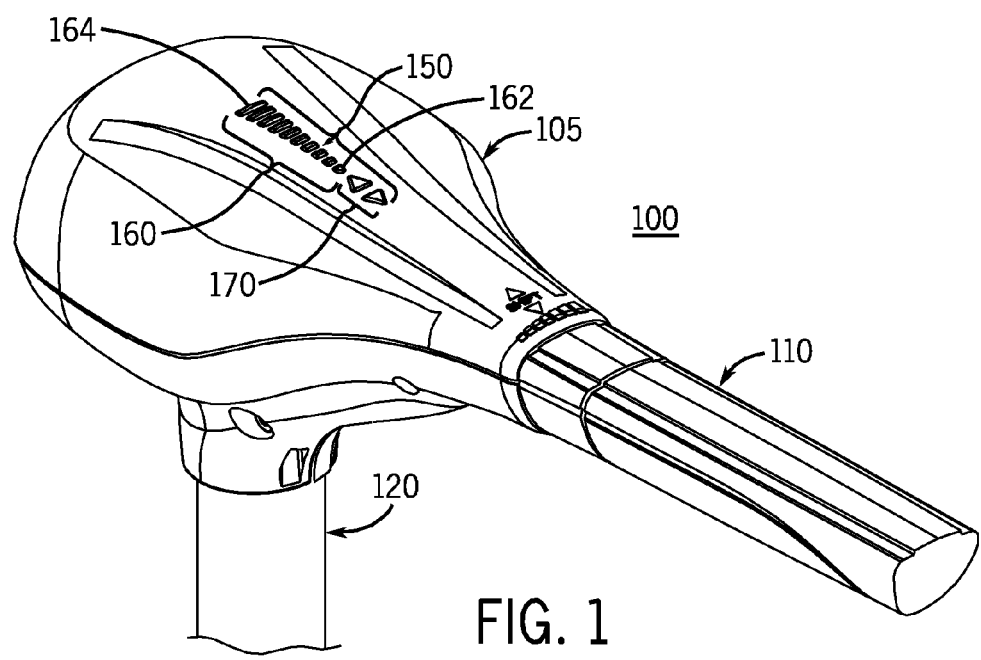
FIG. 1 is a graphical representation illustrating a trolling motor head assembly incorporating an embodiment of the integrated battery level indicator of the present application.

FIG. 1 is a graphical representation illustrating a trolling motor controller head assembly 100 according to an embodiment of the present application. This assembly 100 includes a throttle shaft 110 such that a user can control the speed and direction of the motor, as well as a column 120 leading to the motor unit (not shown). The controller head cover 105 is configured to provide apertures to receive the indicator display 150 through the controller head cover 105, thus viewable by a user. The indicator display 150 includes a bar graph display 160 configurable to indicate both throttle level indication, as well as battery level indication, and a direction indicator display 170 to indicate to a user the direction of the motor. The bar graph display 160 further includes a first bar 162 and a last bar 164 which will be discussed in greater detail below. In speed mode, the bar graph display 160, displays the current throttle level in a bar configuration, that is illuminating all of the bars from the first bar 162 up to the level of the throttle. Once the user operates the trolling motor and turns the throttle off with the throttle shaft 110, the direction indicator display 170 turns off and the bar graph display 160 displays the battery voltage in a dot configuration. The dot configuration includes lighting up only a single LED to show the current battery voltage level.

Figure 2:
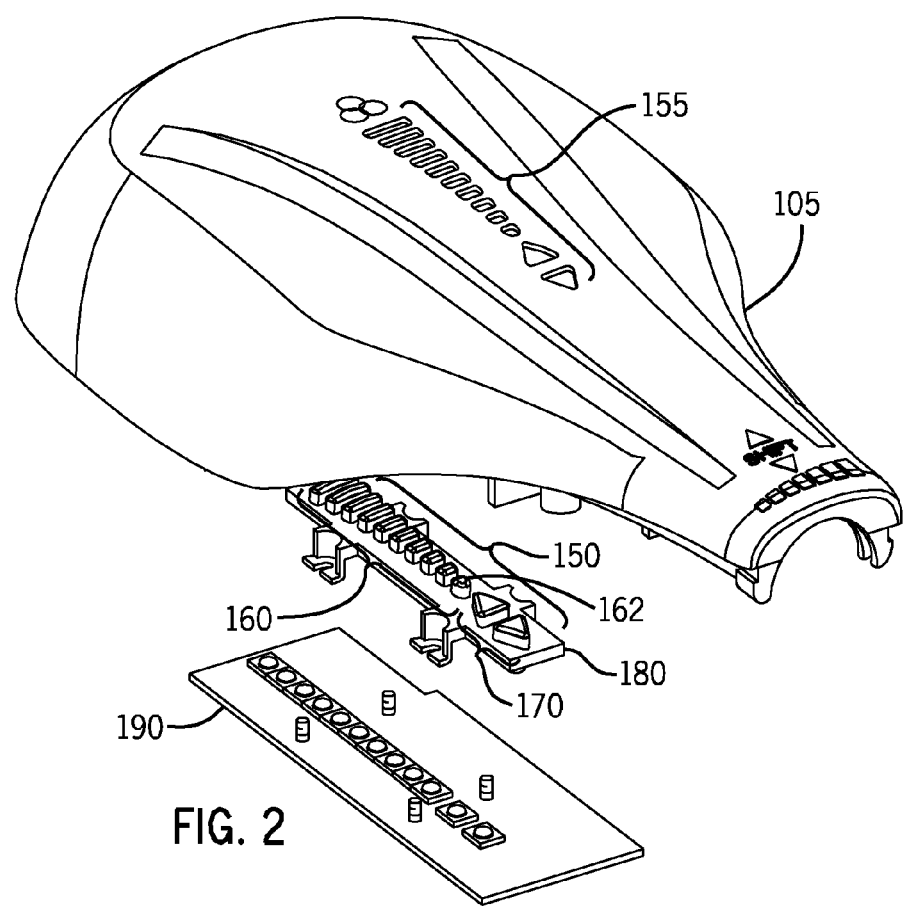
FIG. 2 is a graphical representation illustrating a trolling motor head assembly incorporating an embodiment of the integrated battery level indicator of the present application.

FIG. 2 illustrates the high brightness, high visibility LED 10-position bar graph 160 and direction indicator 170. The bar graph 160 has a voltage offset in that the first bar 162 is not 0 volts, rather the lowest voltage that the trolling motor will operate at before automatically turning off to prevent unsafe operating conditions. In one embodiment, the first bar 162 for a 12 volt trolling motor indicates a 9 volt charge, and each step up on the bar graph 160 indicates an approximate 0.5 volt increase, with the last bar 164 reporting 13.5 volts (12 volt battery can typically be fully charged to 13.5 volts). In another embodiment, for 24 volt trolling motors, the bar graph 160 scale is doubled with a range from 18 volts at the first bar 162 to 27 volts at the last bar 164 in approximately one volt increments. For a 36 volt trolling motor embodiment, the bar graph is scaled 3 times that of the 12 volt battery embodiment. A PWM inhibit signal goes low when the trolling motor shuts off and the circuit 200 (FIG. 3) goes into battery mode, wherein the battery level is displayed on the LEDs for a charge time of capacitor C104 in the battery level circuit 200. Referring back again to FIG. 2, the indicator display 150 is preferably mounted to the controller board 190 of the controller head assembly 100 such that electrical connections to the battery level circuit 200 can be made. The indicator display 150 is preferably configured such that the LEDs protrude through and display through indicator aperture 155 in the controller head cover 105.

Referring now to FIG. 3, the battery level circuit 200 provides a digital, ten-segment LED bar graph display LED1-LED10 & 160 (FIGS. 1 & 2). It is proportional to a range of variable throttle control, providing an indication of what range of speed the motor is currently on. Forward and reverse indication is maintained by the direction indicator LED 12-LED 13 & 170 (FIGS. 1 & 2), along with display on-off control is provided, based on control signals from the controller. The circuit 200 provides constant current LED drivers to maintain throttle indication at a constant brightness, regardless of the charge of the trolling battery. The indicator display 150 goes into standby mode when the controller is in standby mode to conserve power and reduce drain on the battery when trolling motor is not in use. It should be noted that any values for any of the components shown in the battery level circuit 200 of FIG. 3 are those utilized in an exemplary embodiment. One skilled in the art should recognize that other component values may be used that will allow the circuit to operate as described in the present application.

The indicator display 150 is connected to the controller by 7 signals, via a connector J101. A description of these signals include:

V++ is unregulated battery voltage coming directly from the controller. This is used to power the indicator display 150, and to provide a means of measuring the battery voltage;

PWM Inhibit signal indicates to the indicator display 150 when it should be in speed or battery mode, a low PWM inhibit indicates battery mode;

F/R Select indicates to the indicator display 150 which direction the trolling motor is being run in;

POT Hi is a reference signal, which indicates to the indicator display 150, where the low end of the speed range is located (higher voltage).

POT Wiper indicates to the indicator display 150 at what point the speed is between the two reference points; and POT Lo is a reference signal which indicates to the indicator display 150 where the top end of the speed range is located (lower voltage).

When POT Wiper is closer to POT Lo, as it comes from the controller, this indicates top speed. U104C reverses this operation, so that the 1C (U105) operates correctly, so as POT Wiper is closer to POT Lo, this now indicates "off".

IC U105 is a unique 10 segment LED driver with built-in circuitry to provide a linear bar graph display, based on three signals: RHI, RLO and SIG. SIG is the input voltage, and RHI/RLO are reference voltage levels. As SIG varies between RI-11/RLO, the ICU105 represents this as a bar graph, and displays their representations to a user with the LEDs (LED 1-LED 10).

In speed mode, POT Hi, POT Lo and POT Wiper are allowed to pass through to ICU105. The IC is configured to indicate speed in bar mode, so that each speed level is indicated by lighting successive LEDs (LED1-LED10), from lowest to highest. Referring to the battery level circuit 200 of FIGS. 3A and 3B, preferably the POT Lo is fixed at approximately four volts and the POT Hi is fixed at eight volts, leaving an approximate four volt difference between the two pins. The POT Wiper signal can vary in the range from four to eight volts. As stated previously, these signals are allowed to pass through the IC U105, however POT Wiper is inversely proportional to the final LED display. The U104 is receiving the POT Wiper signal into part A, buffers the POT Wiper signal, and then feeds the buffered signal through U104 part C such that the POT Wiper signal is inverted at the input 9. The output then of pin 8 of U104C the POT Wiper signal is inverted. This signal is entered into the SIG pin of U105, and the level is displayed appropriately from the first bar 162 to the appropriate corresponding LED. As an example, a four volt POT Wiper signal will be inverted to an eight volt signal equal to the POT Hi, and thereby displayed by the ICU105 as full throttle, lighting all ten LEDs.

As stated earlier, PWM Inhibit provides the signal necessary to determine if the display should be in speed or battery mode. This signal trips battery mode via an RC circuit made up of R107 and C104. This RC circuit provides about a three second delay so that after battery mode has been displayed for three seconds, the display turns itself off to conserve battery power.

In battery mode, POT Hi, POT Lo, and POT Wiper are bypassed by transistors Q102-104. The voltage generated when Q102 is activated is provided by an onboard voltage regulator to provide a reference voltage +VREF in order to compare battery voltage V++ against. The voltage generated when Q103 is activated is the lower reference voltage +VREF for battery mode, and is generated by a voltage divider and the same reference voltage +VREF from the onboard regulator. The voltage generated when Q104 is activated is a scaled battery voltage which falls between the these two reference voltages. Q105 controls the mode pin of the IC, which tells it to be in bar or dot mode. In battery mode, dot illumination is selected to indicate battery voltage (only one LED is lit at a time). In speed mode, bar illumination is selected, that is, lighting the LED showing the current speed and allowing the LEDs below the current speed LED to also remain illuminated. This provides a distinction between speed and battery mode.

Figure 3A:
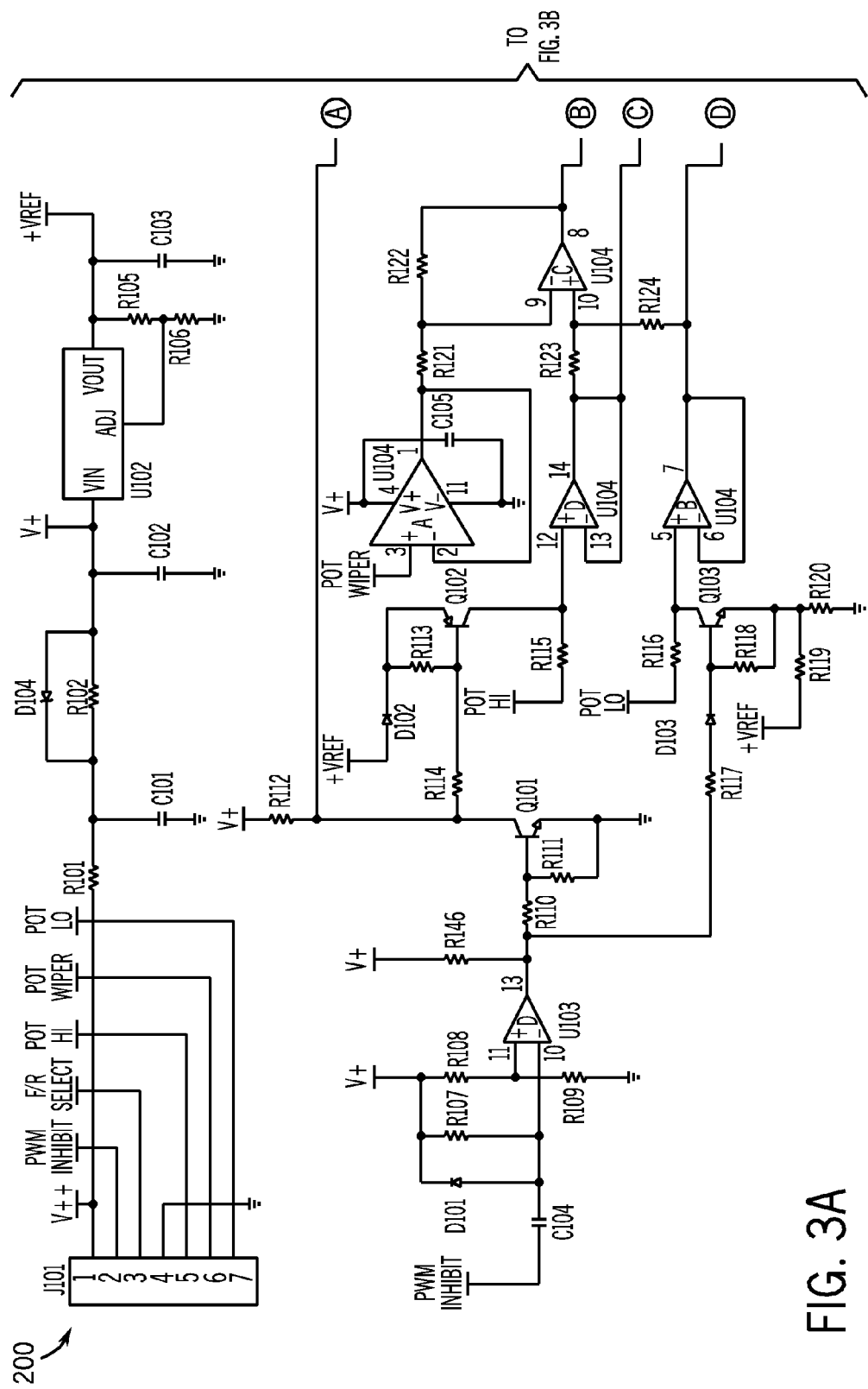
FIGS. 3A and 3B are schematic diagrams illustrating an integrated battery level circuit according to an embodiment of the present application.
Figure 3B:
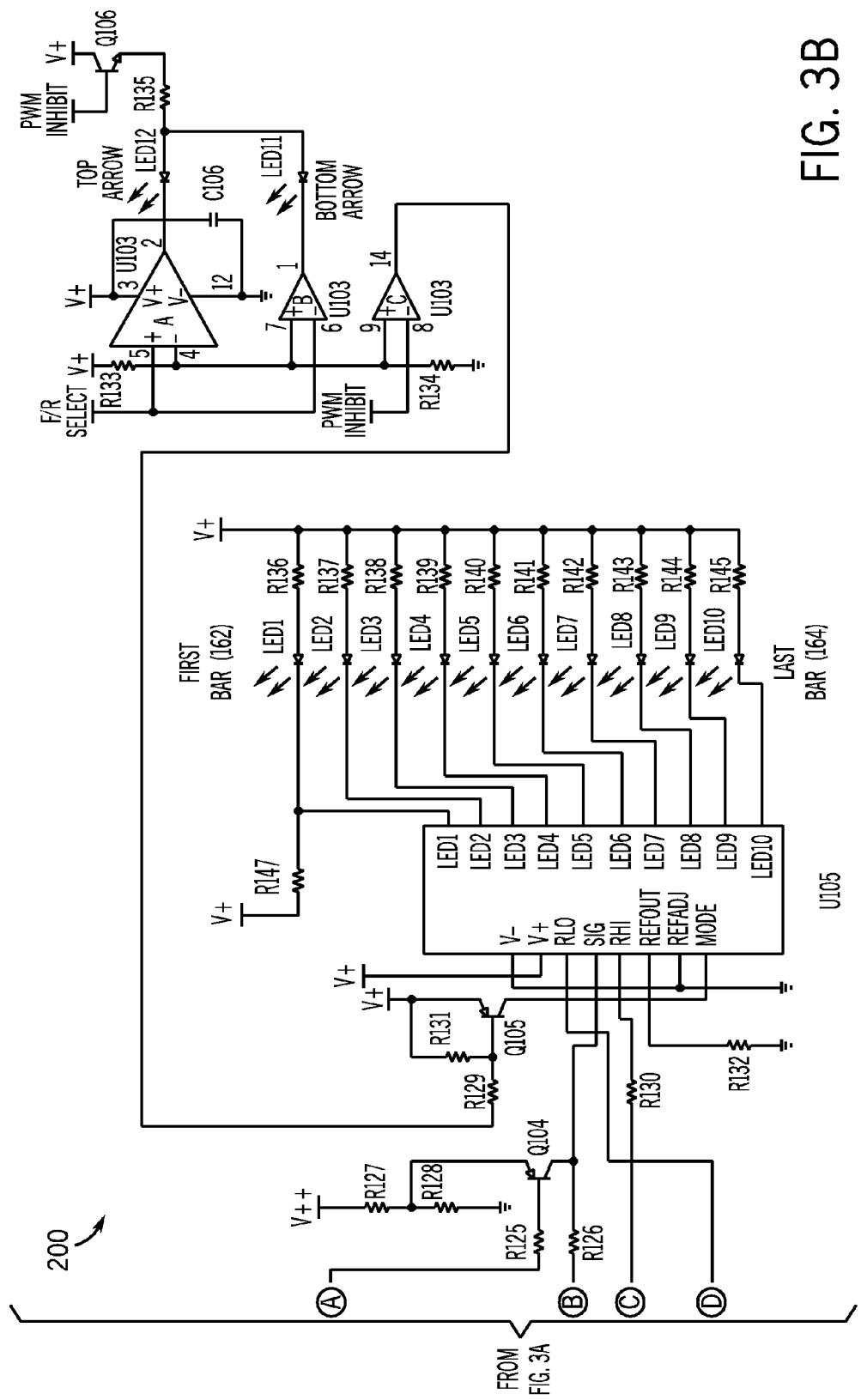

Referring still to FIGS. 3A and 3B, the battery level circuit 200 includes comparator U103, that receives a PWM inhibit signal in pin 8, and when this PWM signal is low due to the user placing the throttle into an off position, U103 inverts the signal, causing Q105 to provide a low resistance path from V+ to the mode pin of the IC U105, thus causing the LEDs to illuminate in a dot configuration for the battery mode. When the PWM inhibit is high and the signal is inverted through the comparator U103, then Q105 provides a high resistance path from V+ to the mode pin, and causes the IC U105 to display the throttle level in a bar configuration from the first bar 162 up to a level corresponding to the current throttle level. Keeping with that portion of the circuit 200, the PWM inhibit signal also is inputted into transistor Q106, and when the PWM inhibit is low, the LED 11 and 12 are turned off, as these LEDs are indication of direction and are not used in battery mode. When the PWM inhibit is high, the transistor Q106 turns on this portion of the circuit, and the F/R select signal determines which LED 11 or 12 is illuminated utilizing the comparator U103.

In speed mode, transistor Q103 is turned off, and has no effect on the POT Lo signal. When the PWM inhibit signal goes low indicating battery mode, it causes Q103 to turn on bringing the voltage at the emitter of Q103, and applying it to pin 5 of U104. The resistor R116 buffers this voltage from POT Lo. The voltage divider including resistors R119 and R120 has a voltage source +VREF, providing a voltage of approximately three volts +VREF is an adjustable regulator, preferably 5 volts plus a diode voltage drop from D102 or approximately 5.3 volts. The transistor Q102 functions similarly to the transistor Q103, in that in battery mode, when the PWM inhibit is a low signal, it applies the 5 volts from +VREF (after the 0.3 voltage drop over D102) and applies the 5 volts to pin 12 of U104 bypassing the POT Hi signal. Therefore, there are 5 volts at pin 12 of U104, and a lesser voltage of approximately 3 volts at pin 5 of U104. These two voltages define the scale, and are an upper and lower scaler, respectively. Therefore, if a 12 volt battery is being measured, the 13.5 volts is equated to the 5 volt high reference, then the bottom level, or last bar 162 (indicating 9 volts) that will be lit on the bar graph display 160 is roughly equated to the low reference, 3 volts. This scaling can occur for other level batteries as needed. For example, a 24 volt battery, 27 volts is equated to the 5 volt high reference and 18 volts equated to the low reference, 3 volts. A 36 volt battery would have 40.5 volt equated to the 5 volt high reference, and 27 volt equated to the low reference, etc. This scaling is a very important aspect of the present application, as if the case occurs where a 12 volt battery falls too far below the range of 8 volts, such a battery would need to be replaced. Therefore, having a first bar 162 representing the lowest charge of a battery that is able to operate at a level of 9 volts, allows the user of the trolling motor to seek a battery charge prior to the battery draining to a fatal level. It should be noted that the values given above with respect to +VREF, as well as the calculated values for the upper and lower scales for the upper and lower voltage reference values, may be adjusted to accommodate particular systems accordingly. The values provided above are those of preferred embodiment, and should not limit the invention to these values.

Referring again back to the circuit 200 of FIGS. 3A and 3B these reference voltages are then inputted into the IC U105 at RLo and RHi. Lastly, the transistor Q104 performs the same scaling function on the V++, which is the battery voltage. The actual battery voltage V++ is therefore scaled appropriately as was done with the POT Hi and POT Lo references, and is entered into the SIG input of the IC U105 such that the IC U105 is able to compare the SIG input to the RHi and RLo inputs, and illuminate the appropriate single LED, indicating the battery voltage. The POT Wiper signal in battery mode is overridden by the transistor Q104, and has no effect on the LED indicators at all in battery mode. The POT Wiper signal is therefore only utilized in speed mode.

Figure 4:
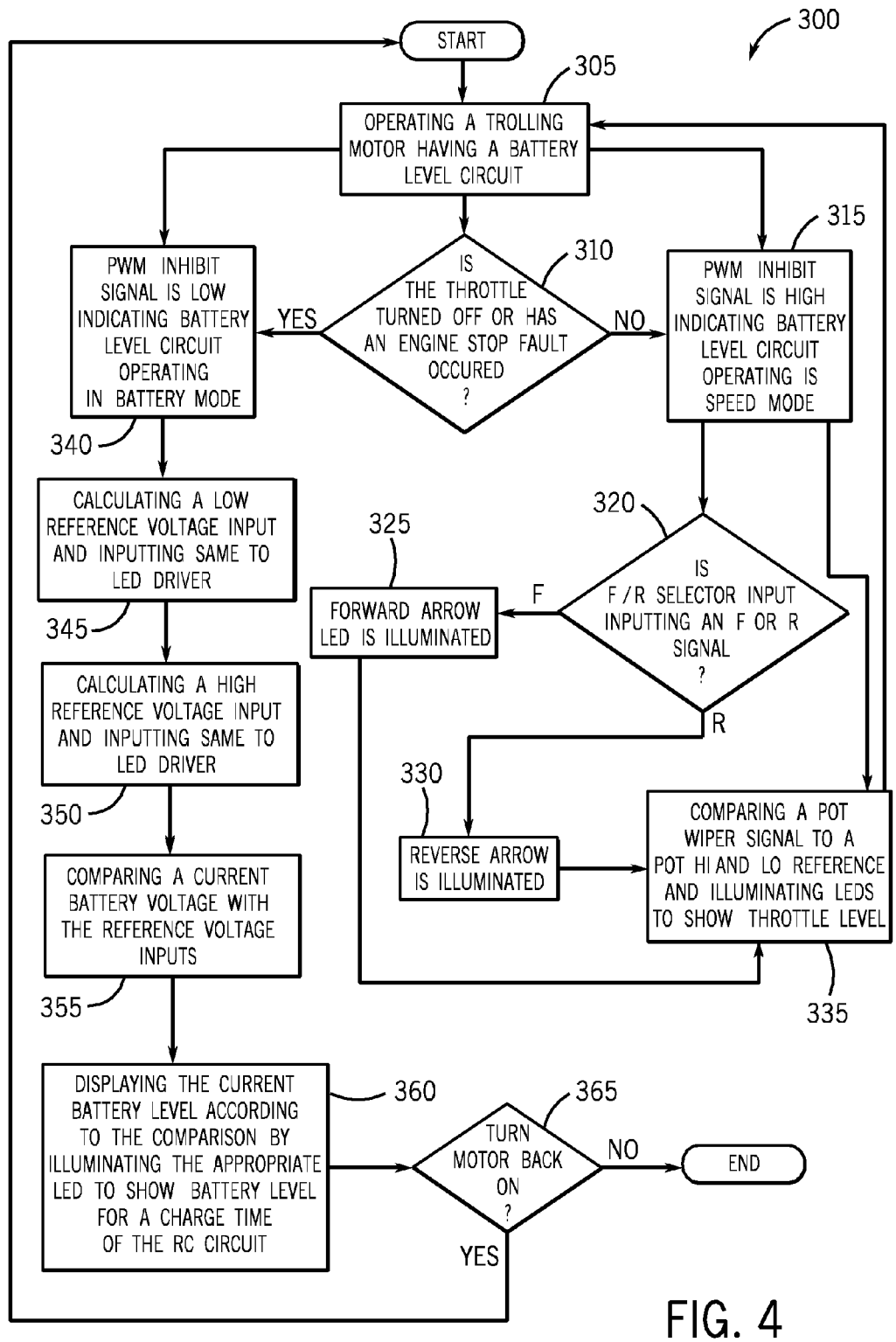
FIG. 4 is a flow chart illustrating a method according to an embodiment of the present application.

Referring now to FIG. 4, a method 300 of integrated battery level indication is illustrated. Step 305 indicates normal operation of a trolling motor having a battery level circuit as described above and in the figures of the application. In step 310, if the throttle of the trolling motor is turned off or has an engine stop fault, then the method 300 proceeds to step 340. If no such throttle shut off occurs, then in step 315, a pulse width modulated (PWM) inhibit signal is high, indicating battery level circuit is operating in speed mode. In step 335, when in speed mode, a POT Wiper signal is compared to a POT Hi and POT Lo reference signals, and an LED driver illuminates the appropriate level of LEDs to show the throttle level of the motor. It should be noted that preferably in speed mode, a bar configuration of the LEDs is used, such that the appropriate LED indicating the speed of the motor is illuminated, as well as all of the LEDs below that illuminated LED in the display. Further, in step 320, in speed mode the PWM inhibit high signal causes an F/R selector input circuit to be on thus if an F signal is being inputted into this circuit in step 320, then a forward arrow LED is illuminated in step 325. If the R signal is selected (the motor is in reverse), then a reverse arrow is illuminated in step 330. The speed mode is in operation as long as the trolling motor is operating in step 305. Referring back to step 340 of the method 300 in FIG. 4, when the throttle is turned off or an engine stop fault has occurred, the PWM inhibit signal is low, thereby operating the battery level circuit in battery mode. The F/R selector 320 is not operation when in battery mode, and in step 345, a low reference voltage input is calculated and inputted into an LED driver. The calculation of this low referage voltage input is further explained above with respect to the circuit diagram of FIGS. 3A and 3B. Likewise, in step 350, a high reference voltage input is calculated and inputted into the same LED driver. In step 355, a battery voltage is compared with these reference voltages, in the LED driver, and in step 360, this level is displayed according to the comparison and the appropriate LEDs are illuminated to show battery level. It should be noted that this battery level is displayed in dot configuration, that is illuminating only a single LED that indicates the current battery level of the trolling motor battery. Further, and still referring to step 360, the battery level is displayed for a charge time of an RC circuit in the battery level circuit. Once the RC circuit has charged the capacitor in the RC circuit, then the display turns off to conserve power. Preferably, the display is configured on the top side of a control head assembly of a trolling motor so as to be easily viewable by a user of the trolling motor. In step 365, if the motor is not turned back on, then the method 300 ends. If the motor is turned back on in step 365, then normal operating of the trolling motor commences in step 305.

The present invention has been described in terms of specific embodiments incorporating details to facilitate the understanding of the principals of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A battery level circuit for a trolling motor, the circuit comprising:
   an LED driver, the LED driver including a low reference voltage input, a high reference voltage input, and a battery voltage input;
   a low reference voltage generator, including a low reference transistor (Q103), a buffering resistor, an operational amplifier and a voltage divider, wherein the low reference voltage generator receives a reference input, outputs a low reference scaler and provides the low reference voltage input to the LED driver based on the low reference scaler and a maximum battery voltage;
   a high reference voltage generator including a high reference transistor (Q102), a reference diode and the operational amplifier, wherein the high reference voltage generator receives the reference input, outputs a high reference scaler, and provides the high reference voltage input to the LED driver based on the high reference scaler and a maximum battery voltage; and a battery voltage input circuit including a battery voltage transistor (Q104), the battery voltage input circuit providing the battery voltage input to the LED driver, wherein the LED driver compares the battery voltage input to the low and high reference voltage inputs and illuminates an appropriate number of a plurality of LEDs according to the comparison.

2. The circuit of claim 1, wherein the plurality of LEDs are coupled with a controller head assembly of the trolling motor such that the plurality of LEDs are easily viewable by a user.

3. The circuit as claimed in claim 2, wherein the plurality of LEDs are coupled with a controller board of the trolling motor inside the controller head assembly, and are configured to be viewable to the user through a plurality of apertures in the controller head cover.

4. The circuit as claimed in claim 1, further comprising a pulse width modulated (PWM) inhibit signal, wherein a low value of the PWM inhibit signal places the circuit in a battery mode, thus activating the low reference transistor, the high reference transistor and the battery voltage transistor, such that the low reference voltage, high reference voltage, and battery voltage are inputted to the LED driver.

5. The circuit as claimed in claim 4, further comprising an RC circuit, wherein when the PWM inhibit signal is low, the RC circuit charges a capacitor (C104) for a charging time, and further wherein the LED driver is powered off at the end of the charging time, such that the battery level in the battery mode is only displayed for the charging time of the capacitor.

6. The circuit as claimed in claim 4, further comprising a speed mode when the PWM inhibit signal is high, wherein a POT Hi signal, a POT La signal and a POT Wiper signal bypass the low reference transistor, the high reference transistor and the battery voltage transistor, and are inputted into the LED driver, such that the LED driver compares the POT Wiper signal to the POT Hi and POT Lo signals to calculate and display a current throttle condition of the trolling motor, further wherein the current throttle is displayed on the plurality of LEDs.

7. The circuit as claimed in claim 6, wherein a high PWM inhibit signal is inputted into a mode input of the LED driver and causes the LED driver to illuminate the throttle condition of the motor in a bar configuration, wherein the bar configuration includes illuminating all of the plurality of LEDs up to an LED corresponding to the throttle condition of the trolling motor.

8. The circuit as claimed in claim 6, wherein a low PWM inhibit signal is inputted into a mode input of the LED driver and causes the LED driver to illuminate the battery level in a dot configuration, wherein the dot configuration includes illuminating one of the plurality of LEDs corresponding to the battery level.

9. The circuit as claimed in claim 6, wherein a directional sensor circuit is activated when the PWM inhibit signal is high, the directional sensor circuit further receiving a F/R select signal, the F/R select signal activating an appropriate one of a top or bottom arrow LED, thus indicating a current operating direction of the trolling motor.

10. The circuit as claimed in claim 1, wherein the reference input has a value of 5.3 volts.

11. The circuit as claimed in claim 1, wherein the LED driver is an integrated circuit chip.

12. The circuit as claimed in claim 1, wherein the LED driver is a constant current driver.

13. A method of battery level indication for a trolling motor, the method comprising:

calculating a low reference voltage input, and inputting the low reference voltage input into an LED driver;

calculating a high reference voltage input, and inputting the high reference voltage input into the LED driver;

inputting a current battery voltage into the LED driver, and comparing the current battery voltage with the reference voltage inputs; and displaying the current battery level according to the comparison, and illuminating an LED to illustrate the current battery level.

14. The method of claim 13, further comprising coupling a plurality of LEDs with a controller head assembly of the trolling motor such that the plurality of LEDs are easily viewable by a user.

15. The method as claimed in claim 14, further comprising coupling the plurality of LEDs with a controller board of the trolling motor inside the controller head assembly, configured to be viewable to the user through a plurality of apertures in the controller head cover.

16. The method as claimed in claim 13, further comprising activating the calculating steps with a pulse width modulated (PWM) inhibit signal, when a low value of the PWM inhibit signal places the battery level circuit in a battery mode.

17. The method as claimed in claim 16, further comprising powering the LED driver for a charging time of a capacitor (C104) with an RC circuit, wherein when the PWM inhibit signal is low, the RC circuit charges, wherein the LED driver is powered off at the end of the charging time, such that the battery level in the battery mode is only displayed for the charging time of the capacitor.

18. The method as claimed in claim 16, further comprising activating a speed mode when the PWM inhibit signal is high, further comprising inputting a POT Hi signal, a POT Lo signal and a POT Wiper signal into the LED driver, and further comprising the LED driver comparing the POT Wiper signal to the POT Hi and POT Lo signals and calculating and displaying a current throttle condition of the trolling motor, further wherein the current throttle is displayed on the plurality of LEDs.

19. The method as claimed in claim 18, further comprising inputting a high PWM inhibit signal into a mode input of the LED driver, causing the LED driver to illuminate the throttle condition of the motor in a bar configuration, wherein the bar configuration includes illuminating all of the plurality of LEDs up to an LED corresponding to the throttle condition of the trolling motor.

20. The method as claimed in claim 18, further comprising inputting a low PWM inhibit signal into a mode input of the LED driver, causing the LED driver to illuminate the battery level in a dot configuration, wherein the dot configuration includes illuminating one of the plurality of LEDs corresponding to the battery.

21. The method as claimed in claim 18, wherein a directional sensor circuit is activated when the PWM inhibit signal is high, the directional sensor circuit further receiving a F/R select signal, the F/R select signal activating an appropriate one of a top or bottom arrow LED, thus indicating a current operating direction of the trolling motor.

22. The circuit as claimed in claim 13, wherein the LED driver is an integrated circuit chip.

23. The circuit as claimed in claim 13, wherein the LED driver is a constant current driver.

24. A controller head assembly for a trolling motor, the assembly comprising:

a plurality of apertures configured on a controller head cover;

a plurality of LEDs coupled with a battery level circuit configured inside the controller head assembly, the plurality of LEDs viewable through the plurality of apertures in the controller head assembly; and a throttle handle rotatable about an axis, such that when the throttle handle is rotated to a throttle off position, the battery level circuit compares a battery voltage input to a scaled low and high reference voltage input and illuminates one of the plurality of LEDs according to the comparison to indicate a current battery level.

* * * * *